US006931479B2

(12) United States Patent
Choi

(10) Patent No.: US 6,931,479 B2
(45) Date of Patent: Aug. 16, 2005

(54) METHOD AND APPARATUS FOR MULTI-FUNCTIONAL INPUTS OF A MEMORY DEVICE

(75) Inventor: Joo S. Choi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 322 days.

(21) Appl. No.: 10/379,759

(22) Filed: Mar. 4, 2003

(65) Prior Publication Data

US 2004/0177210 A1 Sep. 9, 2004

(51) Int. Cl.[7] .......................... G06F 12/00; G11C 14/00
(52) U.S. Cl. .......................... 711/5; 711/100; 711/154; 365/189.01; 365/230.03; 365/230.05
(58) Field of Search .......................... 711/5, 100, 154; 365/154, 189.01, 189.03, 189.12, 230.01, 230.03, 230.05

(56) References Cited

U.S. PATENT DOCUMENTS

| | | | | |
|---|---|---|---|---|
| 5,703,831 A | * | 12/1997 | Sawada | 365/233 |
| 5,999,458 A | * | 12/1999 | Nishimura et al. | 365/189.05 |
| 6,034,916 A | * | 3/2000 | Lee | 365/233 |
| 6,035,369 A | | 3/2000 | Ware et al. | 711/105 |
| 6,084,822 A | * | 7/2000 | Maeda | 365/233 |
| 6,141,276 A | | 10/2000 | Mullarkey et al. | 365/203 |
| 6,266,737 B1 | | 7/2001 | Ware et al. | 711/105 |
| 6,289,476 B1 | | 9/2001 | Cowles | 714/718 |
| 6,324,118 B1 | * | 11/2001 | Ooishi | 365/233 |
| 6,347,354 B1 | | 2/2002 | Abhyankar et al. | 711/5 |
| 6,466,511 B2 | * | 10/2002 | Fujita et al. | 365/233 |
| 6,469,940 B1 | * | 10/2002 | Tsuda | 365/189.05 |
| 6,493,789 B2 | | 12/2002 | Ware et al. | 711/105 |
| 6,496,897 B2 | | 12/2002 | Ware et al. | 711/105 |
| 6,515,914 B2 | * | 2/2003 | Keeth et al. | 365/189.05 |

* cited by examiner

Primary Examiner—Tuan V. Thai
(74) Attorney, Agent, or Firm—Dorsey & Whitney LLP

(57) ABSTRACT

A memory device having multi-functional input terminals to provide greater flexibility without adding new input terminals. The memory device takes advantage of input terminals of a memory device which may be used only under specific conditions, or for specific commands. Input terminals unused in a particular mode of operation can be used to provide additional functionality. Consequently, the present invention take advantage of input terminals that remain unused during particular operations, conditions, or modes, to provide additional functionality or flexibility to a memory device.

39 Claims, 5 Drawing Sheets

METHOD AND APPARATUS FOR MULTI-FUNCTIONAL INPUTS OF A MEMORY DEVICE

TECHNICAL FIELD

The present invention relates generally to integrated circuits, and more specifically, approaches to providing more power efficient and greater functionality semiconductor memory devices through the use of multi-functional inputs and terminals.

BACKGROUND OF THE INVENTION

Semiconductor memory devices have continued to have increased memory capacity, decreased access times, and greater functionality over their predecessors. However, as a result of designing memory devices having higher capacity, higher speed, and greater functionality, current memory devices typically consume more power than their predecessors during normal operation. Additionally, the number of inputs, or correspondingly, the number of signals that need to be provided to a memory device for normal operation has increased significantly.

Although power consumption has been in the past of some concern, it has more recently become an issue of much greater significance. There are many reasons for wanting to design more power efficient memory devices. One such reason is that many applications in which current memory devices are used are for portable applications, which typically means that power is supplied by batteries, or other lightweight and fixed capacity power supplies. Generally speaking, consumers find it undesirable to replace batteries, or be forced to recharge batteries often. Consequently, memory device manufacturers have made an effort in designing more power efficient memory devices. Whatever the particular reason, the issue of the increased power consumption of current memory devices cannot be ignored.

With respect to the number of pins or inputs on a memory device, it is often undesirable to have a memory device with many pins. That is, more leads often means that more signals need to be provided. As a result, signal drivers, controllers, and circuit boards need to be more complex. Additionally, more leads also often means larger memory devices, or if not larger, then a memory device is very narrow pitch between leads. Neither one of these situations is looked upon as desirable.

Many different approaches have been taken to address the issue of increased power consumption of current memory devices. For example, one straight forward approach has been to use higher capacity batteries that can provide higher power over a greater period of time before the need for recharging or replacement. However, these higher capacity batteries are generally more expensive, and are often larger and heavier. Also, as previously discussed, consumers dislike the inconvenience of changing batteries or charging rechargeable batteries often. Moreover, the approach fails to directly address the issue of power consumption by memory devices.

Other approaches have been directed to designing more power efficient memory devices, for example, designing more sophisticated internal voltage regulators and internal power supplies so that relatively less power is consumed during operation of the memory device. These types of approaches are often desirable, since many of the different designs, which may not save a significant amount of power by themselves, can be incorporated together in a memory device such that the cumulative power savings are significant. Therefore, there is a need for additional approaches to designing efficient, lower-power consuming memory devices.

SUMMARY OF THE INVENTION

The present invention is directed to a memory device having multi-functional input terminals. The memory device has address terminals for receiving input signals and command terminals for receiving command signals. In one aspect of the invention, the memory device further includes a memory array having at least one bank of memory partitioned into a plurality of sub-banks of memory cells, the memory cells in each sub-bank arranged in rows and columns of memory cells. A first address decoder coupled to the address terminals and the memory array is included to select a row of memory to be accessed corresponding to a memory address represented by a first set of input signals applied to the address terminals, and a second address decoder coupled to a first portion of the address terminals and the memory array is also included to select a column of memory to be accessed corresponding to a memory address represented by a second set of input signals applied to the first portion of the address terminals. The second set of input signals includes less input signals than the first set of input signals. A command decoder coupled to the address terminals and the first address decoder generates internal control signals for performing a requested memory operation in response to receiving command signals, and a sub-bank control circuit coupled to a second portion of the address terminals and the command decoder, in response to sub-bank selection signals applied to the second portion of the address terminals, generates sub-bank control signals provided to the command decoder to select at least one of the sub-banks of memory cells on which the memory operation is performed.

In another aspect of the invention, a method of performing a memory operation on a memory array in a memory device having a plurality of address terminals and command terminals, and further having a memory array having at least one bank of memory cells arranged in rows and columns of memory cells is provided. Command signals are received on the command terminals indicative of a memory operation, a first set of address signals is received on the plurality of address terminals, a second set of address signals is received on a first portion of the plurality of address terminals, and sub-bank selection signals are received on a second portion of the plurality of address terminals concurrently with the second set of address signals. A portion of the bank of memory selected by the sub-bank selection signals is activated and the memory operation is performed thereon.

DETAILED DESCRIPTION OF THE INVENTION

Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
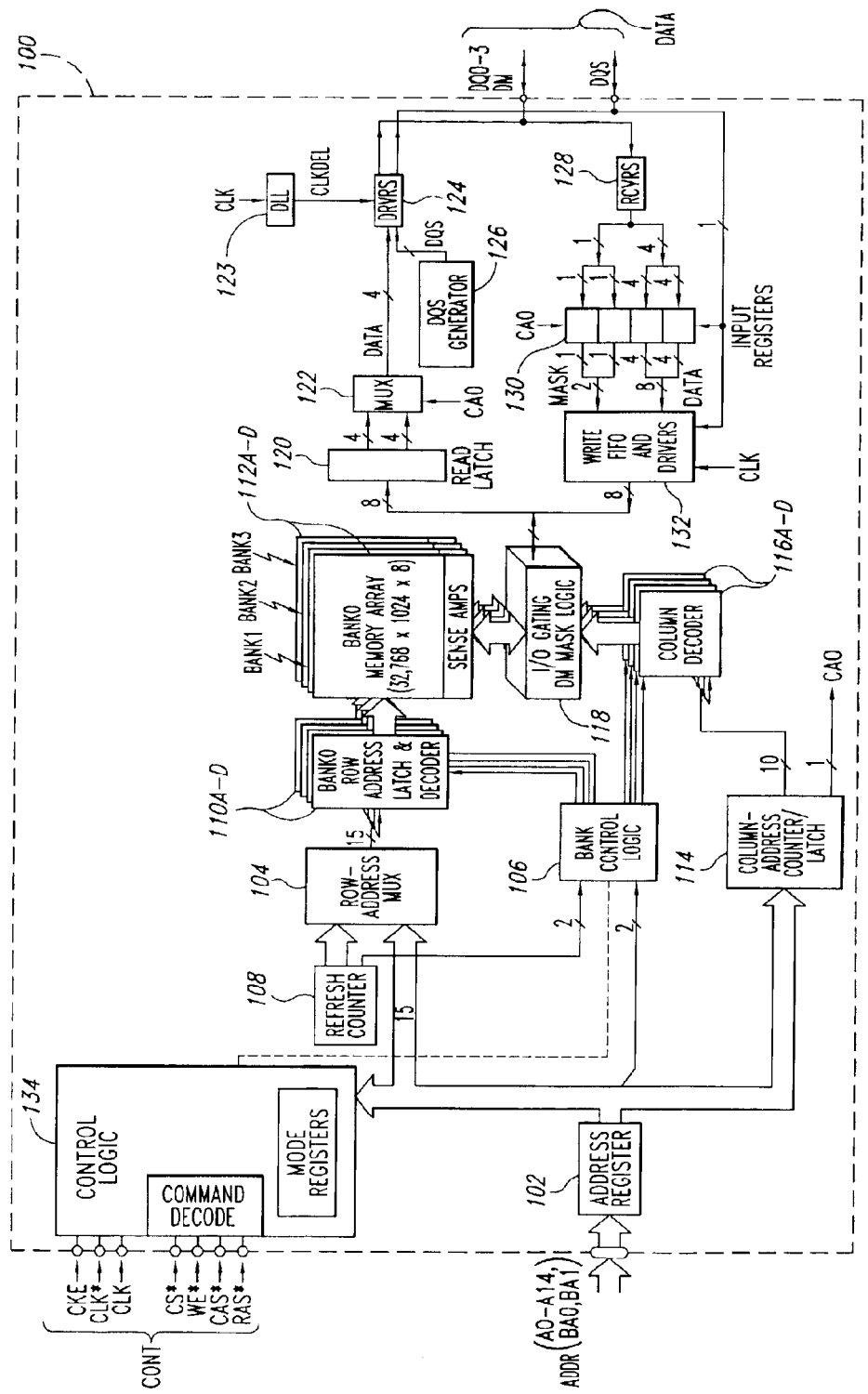
FIG. 1 is a functional block diagram of a conventional synchronous memory device.

FIG. 1 is a functional block diagram of a conventional memory device 100. The memory device 100 in FIG. 1 is a double-data rate (DDR) synchronous dynamic random access memory ("SDRAM"), although the principles described herein are applicable to other types of memory devices, such as conventional synchronous DRAMs (SDRAMs), as well as packetized memory devices like SLDRAMs and RDRAMs.

The memory device 100 includes a control logic and command decoder 134 that receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, precharge, or auto-refresh command. In response to the clock signals CLK, CLK*, the command decoder 134 latches and decodes an applied command, and generates a sequence of clocking and control signals that control components 102–132 to execute the function of the applied command. The clock enable signal CKE enables clocking of the command decoder 134 by the clock signals CLK, CLK*.

The command decoder 134 latches command and address signals at positive edges of the CLK, CLK* signals (i.e., the crossing point of CLK going high and CLK* going low), while the input registers 130 and data drivers 124 transfer data into and from, respectively, the memory device 100 in response to both edges of a data strobe signal DQS and thus at double the frequency of the clock signals CLK, CLK*. This is true because the DQS signal has the same frequency as the CLK, CLK* signals. The memory device 100 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 134 in generating the control and timing signals is conventional, and thus, for the sake of brevity, will not be described in more detail.

Further included in the memory device 100 is an address register 102 that receives row, column, and bank addresses over a multiplexed address bus ADDR. That is, the address bus ADDR is used for both row and column address signals. The bank address signals BA0 and BA1 are applied via a dedicated bank address bus (not shown). The addresses are typically supplied by a memory controller (not shown). As shown in FIG. 1, the memory device 100 is a 256 Mbit×4 device, and receives address signals A0–A14 for row addresses and address signals A0–A9, A11 for column addresses.

The address register 102 receives a row address and a bank address that are applied to a row address multiplexer 104 and bank control logic circuit 106, respectively. The row address multiplexer 104 applies either the row address received from the address register 102 or a refresh row address from a refresh counter 108 to a plurality of row address latch and decoders 110A–D. The bank control logic 106 activates the row address latch and decoder 110A–D corresponding to either the bank address received from the address register 102 or a refresh bank address from the refresh counter 108, and the activated row address latch and decoder latches and decodes the received row address.

In response to the decoded row address, the activated row address latch and decoder 110A–D applies various signals to a corresponding memory bank 112A–D to thereby activate a row of memory cells corresponding to the decoded row address. Each memory bank 112A–D includes a memory-cell array having a plurality of memory cells arranged in rows and columns, where the rows of memory cells extend the entire length of the memory bank 112A–D in which the rows are located. After a row of memory cells is activated, the data stored in the memory cells in the activated row are stored in sense amplifiers in the corresponding memory bank. Generally, there is one sense amplifier for each memory cell of a row, and as a result, when a row of memory cells is activated, a corresponding number of the sense amplifiers must be activated in order to store the data of the activated row of memory cells.

The row address multiplexer 104 applies the refresh row address from the refresh counter 108 to the decoders 110A–D and the bank control logic circuit 106 uses the refresh bank address from the refresh counter when the memory device 100 operates in an auto-refresh or self-refresh mode of operation in response to an auto- or self-refresh command being applied to the memory device 100, as will be appreciated by those skilled in the art.

As previously discussed, the ADDR bus is multiplexed so that a column address can applied to and latched by the memory device 100. The address register 102 applies the column address to a column address counter and latch 114 which, in turn, latches the column address and applies the latched column address to a plurality of column decoders 116A–D. The bank control logic 106 activates the column decoder 116A–D corresponding to the received bank address, and the activated column decoder decodes the applied column address. Depending on the operating mode of the memory device 100, the column address counter and latch 114 either directly applies the latched column address to the decoders 116A–D, or applies a sequence of column addresses to the decoders starting at the column address provided by the address register 102. In response to the column address from the counter and latch 114, the activated column decoder 116A–D applies decode and control signals to an I/O gating and data masking circuit 118 which, in turn, accesses memory cells corresponding to the decoded column address in the activated row of memory cells in the memory bank 112A–D being accessed.

During data read operations, data being read from the addressed memory cells is coupled through the I/O gating and data masking circuit 118 to a read latch 120. The I/O gating and data masking circuit 118 supplies N bits of data to the read latch 120, which then applies two N/2 bit words to a multiplexer 122. In the memory device 100 shown in FIG. 1, the circuit 118 provides 64 bits to the read latch 120 which, in turn, provides two 32 bits words to the multiplexer 122. A data driver 124 sequentially receives the N/2 bit words from the multiplexer 122 and also receives a data strobe signal DQS from a strobe signal generator 126 and a delayed clock signal CLKDEL from a DLL 823. The DQS signal is used by an external circuit such as a memory controller (not shown) in latching data from the memory device 100 during read operations. In response to the delayed clock signal CLKDEL, the data driver 124 sequentially outputs the received N/2 bits words as a corresponding data word DQ, each data word being output in synchronism with a rising or falling edge of a CLK signal that is applied to clock the memory device 100. The data driver 124 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the DLL 823 is a delayed version of the CLK signal, and the DLL 823 adjusts the delay of the CLKDEL signal relative to the CLK signal to ensure that the DQS signal and the DQ words are placed on the DATA bus in synchronism with the CLK signal. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 128 receives each DQ word and the associated DM0-X signals, and applies these signals to input registers 130 that are clocked by the DQS signal. In response to a rising edge of the DQS signal, the input registers 130 latch a first N/2 bit DQ word and the associated DM0-X signals, and in response to a falling edge of the DQS signal the input registers latch the second N/2 bit DQ word and associated DM0-X signals. The input register 130 provides the two latched N/2 bit DQ words as an N-bit word to a write FIFO and driver 132, which clocks the applied DQ word and DM0-X signals into the write FIFO and driver in response to the DQS signal. The DQ word is clocked out of the write FIFO and driver 132 in response to the CLK signal, and is applied to the I/O gating and masking circuit 118. The I/O gating and masking circuit 118 transfers the DQ word to the addressed memory cells in the accessed bank 112A-D subject to the DM0-X signals, which may be used to selectively mask bits or groups of bits in the DQ words (i.e., in the write data) being written to the addressed memory cells.

Figure 2:
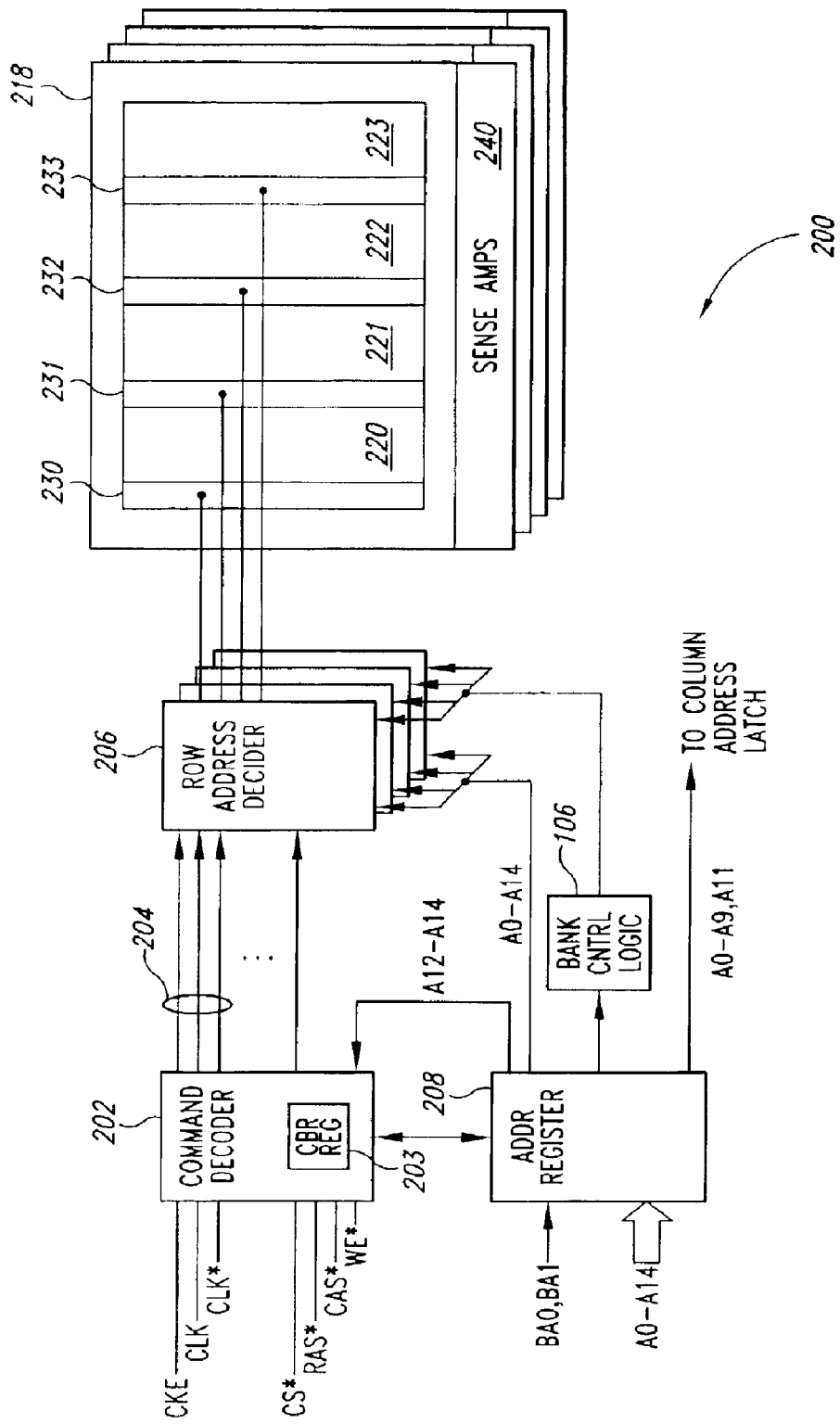
FIG. 2 is a functional block diagram of a portion of a synchronous memory device according to an embodiment of the present invention.

FIG. 2 illustrates portions of a memory device 200 according to an embodiment of the present invention. The memory device 200 shares many similarities with the memory device 100 of FIG. 1, and consequently, the functional blocks in the memory device 200 that are similar to those in the memory device 100 will use common reference numbers. However, as will be explained below, several of the functional blocks of the memory device have been modified according to embodiments of the present invention. It will be appreciated that FIG. 2 does not illustrate all of the functional blocks of the memory device 200, but merely a portion of thereof, in order to avoid obscuring explanation of the embodiment of the present invention. The functional blocks omitted from FIG. 2 are well known by those ordinarily skilled in the art, and consequently, the description provided herein is sufficient to enable those of ordinary skill in the art to practice the invention. Moreover, it will be further appreciated that some of the functional blocks shown in FIG. 2 may be arranged in a different manner without departing from the scope of the present invention. For example, several functional blocks may be integrated into fewer functional blocks, or conversely, subdivided into more functional blocks. Consequently, the particular separation of the functional blocks illustrated in FIG. 2 should not be interpreted as limiting the scope of the present invention.

As shown in FIG. 2, command signals are provided to a command decoder 202, which in turn generates the appropriate internal control signals to execute memory operations. In addition to conventional internal control signals well known in the art, the command decoder 202 generates sub-bank activation signals 204 that are provided to a row address decoder 206. Bank addresses BA0 and BA1 and address signals A0–A14 are provided to an address register 208. The bank addresses BA0 and BA1 are provided to a bank control logic 106 to select one of the banks for access. The address register provides the address signals A0–A14 to the row address latch and decoder 206, and as will be explained in more detail below, also provides the address signals A0–A9, A11 to a column address latch (not shown) and address signals A12–A14 to the command decoder when the address lines are multiplexed from providing row addresses to providing column addresses.

A memory bank 218 of the memory array 110 is also shown in greater detail in FIG. 2. The memory bank 218 includes sub-banks 220, 221, 222, and 223. The memory cells of each of the sub-banks 220–223 are arranged in row lines and column lines, as in a conventional fashion. However, each of the sub-banks 220–223 is coupled to a respective sub-bank row decoder 230, 231, 232, and 233. The respective sub-bank row decoders 230–233 are coupled to the row address decoder 206 to receive a sub-bank row decode signal from the row address decoder 206. Sense amplifiers 240 are coupled to the columns of the sub-banks 220–223 to store the data of the memory cells of an activated row of memory, as well known. The sense amplifiers 240 are coupled to the rest of the memory device as shown if FIG. 1 and operate in a conventional manner.

The embodiment of the present invention shown in FIG. 2 provides the flexibility of activating only a portion of a row line corresponding to a selected sub-bank 220–223 of the memory bank 218 for each memory operation. As previously discussed, with conventional memory devices, an entire row of memory cells extending the entire width of the memory bank 218 is activated for each memory operation. By allowing activation of only a portion of the row line for each memory operation, as provided by embodiments of the present invention, the current consumed by the memory device during a memory access operation can be significantly reduced, since only a fraction of the sense amplifiers, that would otherwise be activated in a conventional memory device, need to be activated during a memory operation in embodiments of the present invention. More specifically, only the sense amplifiers associated with the selected sub-bank, or sub-banks, need to be activated to perform the memory operation.

As will be explained in more detail below, selection of the sub-bank for which the portion of the row is activated is determined by the address signals A12–A14 provided to the memory device 200 while the address inputs are multiplexed to receive column addresses. By virtue of the memory device 200 not having a "square" array, some of the address terminals of the memory device 200 will not be used when providing either the row address or column address. As shown in FIG. 2, the memory device 200 is a 256 Mbit×4 memory device, and the configuration of the available memory is such that there are more addressable rows of memory cells than there are addressable columns of memory cells. Consequently, the number of column address signals required to access a memory location is less than the number of row address signals required. In the particular embodiment shown in FIG. 2, 15 address signals (A0–A14) are provided for each row address, while only 11 address signals (A0–A9, A11) are provided for each column address.

In conventional memory devices, the "remaining" address terminals are "don't cares" when latching the address. However, embodiments of the present invention take advantage of the remaining address terminals to provide greater flexibility and functionality. An advantage provided by the present invention is that no additional terminals need to be provided for implementing embodiments of the present invention. Providing additional terminals to a memory device is often undesirable because of the issues with spacing and size. For example, decreasing the space between leads to accommodate additional leads increases the likelihood of shorting. Adding leads to a memory device without changing lead spacing often results in a larger device package, which is undesirable in applications where small devices are required.

In an embodiment of the present invention, the address signals A12–A14 are provided with a "CAS command" preceding a row activation command. The "CAS before RAS" (CBR) timing is used in the embodiment in order to maintain access times for the memory device 200. Namely, the delay from an active command to execution of a read or write command, or tRCD. In the embodiment, following the row activation command, conventional CAS command timing can be used. A register 203 included in the command decoder 202 stores the CBR CAS command to play a role after a row activation command. Based on the address signals A12–A14, the command decoder 202 generates the sub-bank activation signals 204, which are provided to the row address decoder 206. In turn, the row address decoder 206 generates and provides a sub-bank row decode signal to the appropriate sub-bank row decoder 230–233 for activating the portion of the row line of the selected sub-bank 220–223. The sense amplifiers 240 for the selected sub-bank, or sub-banks 220–223, are activated to store the data of the memory cells, which are then provided to the rest of the memory device 200 in a conventional manner.

Figure 3:
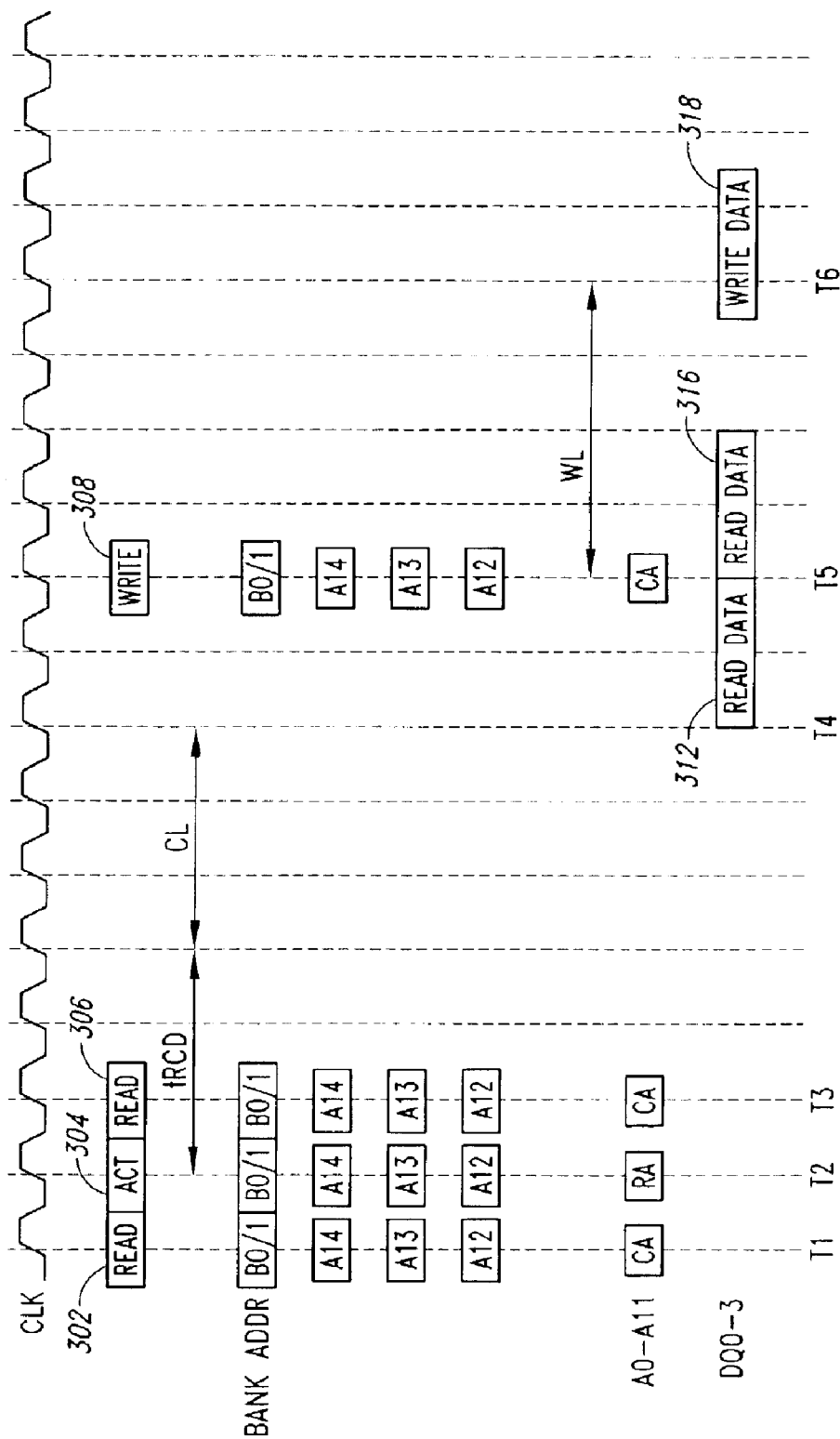
FIG. 3 is a signal timing diagram illustrating various signals generated by and provided to the memory device of FIG. 2 during operation.
Figure 4:
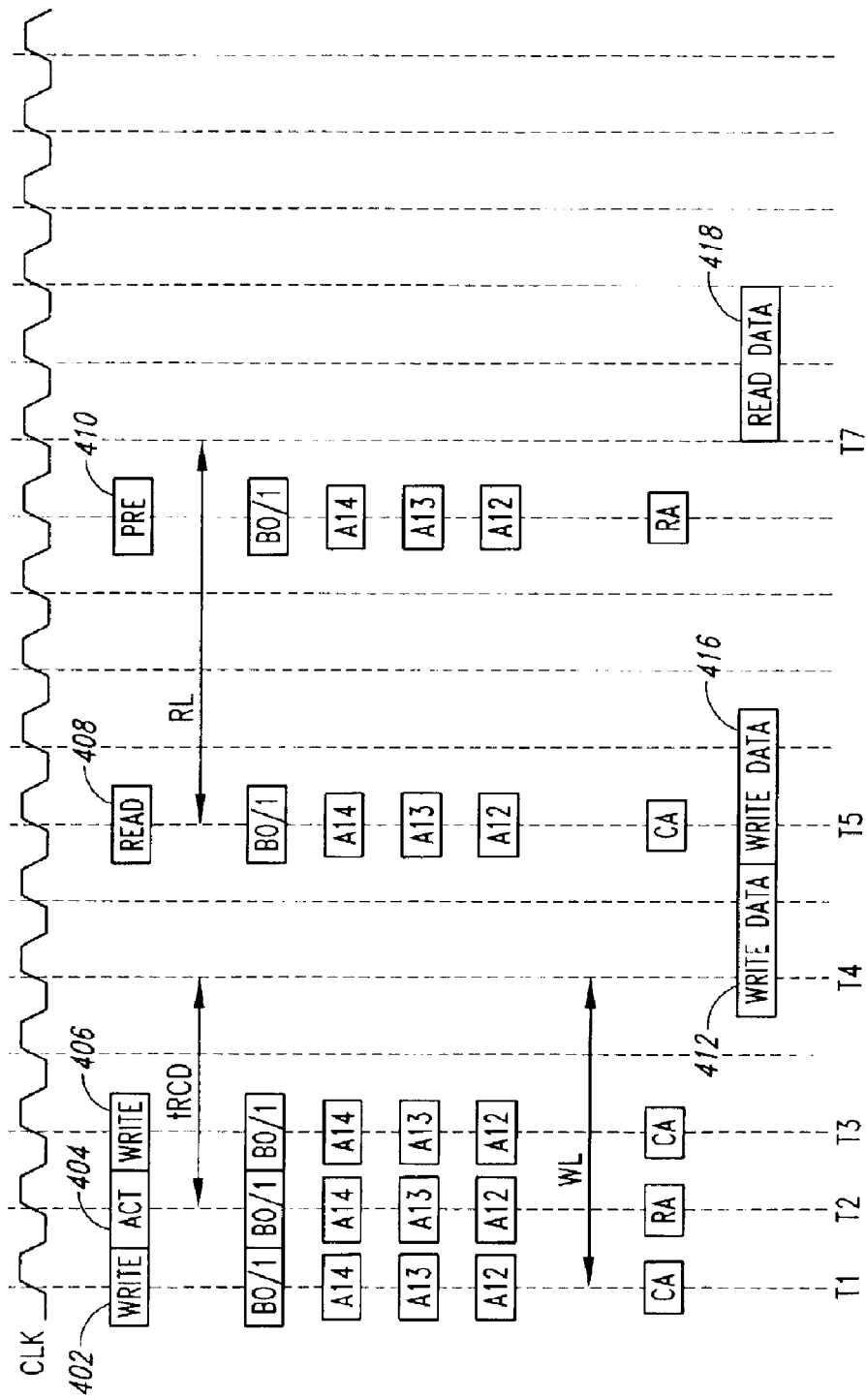
FIG. 4 is a signal timing diagram illustrating various signals generated by and provided to the memory device of FIG. 2 during operation.

Operation of the memory device 200 will now be explained with reference to FIGS. 3 and 4. FIGS. 3 and 4 are timing diagrams for various signals during operation of the memory device 200. FIG. 3 illustrates the timing of signals for two read operations followed by a write operation, and FIG. 4 illustrates the timing of signals for two write operations followed by a read operation and a precharge operation. Those of ordinary skill in the art will appreciate that FIGS. 3 and 4 do not illustrate all of the signals applied to or generated by the memory device 200 during operation, and have been illustrated for the purpose of provided an example. Consequently, the particular signals and timing shown in FIGS. 3 and 4 are not intended to limit the scope of the present invention to any particular embodiment. Moreover, operation of the memory device 200 will be described with respect to one memory bank 218 in order to avoid complicating the description of embodiments of the present invention. However, it will be appreciated by those ordinarily skilled in the art that embodiments of the present invention can be implemented in multi-bank memory devices as well, and the description provided herein pertaining to only one memory bank should not limit the scope of the present invention.

With reference to FIG. 3, at a time T1 the command signals for a read operation (READ) 302 are provided to the memory device 200. The READ operation 302 represents a CAS command that is interpreted by the command decoder 202 as CBR timing to initiate a memory operation where only the portion of a row corresponding to a selected sub-bank 220–223 (FIG. 2) is activated. The READ command 302 is stored in the register 203 for use after a RAS command. Bank addresses BA0 and BA1 (B0/1), and column address (CA) signals A0–A11, are provided to select a memory bank 218 and a column of memory in the selected memory bank 218 to activate, respectively. The address signals A12–A14 are provided at the time T1 for the purpose of selecting which of the sub-banks 220–223 will have a row line activated during the READ operation. It will be appreciated that using address signals A12–A14 provides up to eight different options for activating the sub-banks 220–223 of the memory bank 218. However, the number of signals used for the selection of sub-banks may be modified without departing from the scope of the present invention. Additionally, other sub-bank selection options can be provided than specifically discussed herein. For example, the selection of sub-banks through the use of address signals A12–A14 will be described as selecting which one of four particular sub-banks will have its portion of a row line activated. However, additional sub-bank activation signals 204 can be generated by the command decoder 202 to select more than one sub-bank to have its row activated, such as selecting sub-bank pairs, either sub-banks 220 and 222, or sub-banks 221 and 223. In this way, half of a row or a quarter of a row can be activated for a memory access operation. Another selection that may be implemented is to have in addition to selecting a portion of a row of memory cells to be activated, selecting an entire row of memory cells activated, as is done in conventional memory devices. Such additional options, although not discussed herein in greater detail, can be practiced by those ordinarily skilled in the art based on the description provided.

As previously discussed, the command decoder 202 receives the READ command 302 (i.e., a CAS command), and in response, latches the address signals A12–A14 as external sub-bank select signals. The command decoder 202 interprets the address signals A12–A14 and prepares to generate sub-bank activation signals 204, which will be provided to the row address decoder 206. The address signals A0–A11 are latched by the column address latch and the bank addresses are provided to the bank control logic 106.

At a time T2, an activation command (ACT) 304 is provided to the memory device 200, which initiates the memory access (i.e., read) operation requested by the READ command 302. The read operation will access the row of memory corresponding to the row address signals A0–A14 located in the memory bank selected by the B0/1 signals, and the column of memory corresponding to the column address signals A0–A11 latched by the column address latch in response to the READ command 302. At the time T2, the address register 208 latches the address signals A0–A14, and because the ACT command 304 represents a "RAS command," the command decoder 202 interprets all of the address signals A0–A14 as identifying a row address. Further in response to the ACT command 304, the command decoder 202 generates the appropriate sub-bank activation signals 204 based on the external sub-bank select signals (i.e., address signals A12–A14 latched at the time T1). The sub-bank activation signals 204 are provided to the row address decoder 206 to activate the row of memory cells identified by the address signals A0–A14, which were latched in response to the ACT command 304 and the selected portions of the selected row identified by the address signals A12–A14, which were latched in response to the READ command 302. In addition to the sub-bank activation signals 204, the command decoder 202 generates conventional internal control signals to perform the read operation, as well known.

At a time T3, a second READ command 306 is provided to the memory device 200 to request a read operation. As previously mentioned, conventional signal timing can be used for CAS commands issued subsequent to the CBR timing described above. As previously described with respect to the time T1, in response to the READ command 306, the command decoder 202 interprets only address signals A0–A11 (CA) for identifying a column address, and interprets address signals A12–A14 as external sub-bank select signals to identify which sub-banks will have its portion of the row of memory cells activated. The row of memory identified by address signals A0–A14 at the time T2 is still activated, and consequently, the second read operation will be performed for the activated row and the column identified by the address signals A0–A11 at the time T3. The memory bank 218 is identified by the bank address signals BA0 and BA1 (B0/1).

At a time T4, data 312 read in response to the READ command 302 becomes available on data terminals DQ0–DQ3. At a time T5, data 316 read in response to the READ command 306 becomes available on the data terminals DQ0–DQ3. Also at the time T5, a write operation is requested by providing a WRITE command 308 to the memory device 200. The WRITE command 308 also represents a CAS command and uses conventional signal timing. As a result, a column of memory is identified by the address signals A0–A11 (CA) and address signals A12–A14 are interpreted as external sub-bank select signals by the command decoder 202. The currently activated row remains active, with only those portions corresponding to the sub-bank identified by A12–A14 activated for the write operation. The command decoder 202 will generate the appropriate sub-bank activation signals 204 based on the address signals A12–A14. At a time T6, data 318 to be written to the memory location identified by the row address signals A0–A14 latched at the time T2, and the column address signals A0–A11 latched at the time T5, is provided to the memory device 200.

With reference to FIG. 4, at a time T1, a WRITE command 402 is provided to the memory device 200 (FIG. 2) to request a write operation. Bank addresses BA0 and BA1 (B0/1) are latched by the bank control logic 806, and the address signals A0–A11 (CA) and A12–A14 are latched by the address register at the time T1 as well. The address signals A0–A11 are provided to the column address latch 814. However, in response to the WRITE command, address signals A12–A14 are provided to the command decoder 202 because, as previously discussed with respect to FIG. 3, the WRITE command 402 represents a CAS command. The CBR timing of the WRITE command 402 indicates to the command decoder 202 that the address signals A12–A14 should be interpreted as external sub-bank select signals.

At a time T2, an ACT command 404, bank addresses B0 and BA1, and address signals A0–A14 are provided to the memory device to initiate the write operation for the row corresponding to the address signals A0–A14, in the memory bank 218 identified by the bank addresses BA0 and BA1, and for those portions of the row of memory cells corresponding to the sub-bank, or sub-banks, selected by the external sub-bank select signals provided to the memory device 200 as address signals A12–A14. The column for which the write operation will be performed was identified by the address signals A0–A11 latched at the time T1 with the WRITE command 402.

At a time T3, a second WRITE command 406 is provided to the memory device 200 to request a second write operation to be performed. The second write operation will be performed for the column identified by the address signals A0–A11, which are provided at the same time as the WRITE command 406. The memory bank 218 for the write operation is selected by the bank addresses BA0 and BA1 latched at the time T3. The write operation will be performed for the currently activated row since the row identified by the address signals A0–A14 latched at the time T2 was never precharged, or deactivated. Again, because the WRITE command 406 is a CAS command, the command decoder interprets the address signals A12–A14 as external sub-bank select signals, and will generate the appropriate sub-bank activation signals 204 to select the portions of the active row to be activated for the write operation.

At a time T4, data 412 to be written in response to the WRITE command 402 is provided to the memory device 200 on data terminals DQ0–DQ3. As previously discussed, the data 412 will be written to the memory location at the intersection of the row corresponding to address signals A0–A14 latched at the time T2, and the column corresponding to the address signals A0–A11 latched at the time T1. Additionally, only the portions of the row corresponding to the sub-banks 220–223 selected by the address signals A12–A14 at the time T1 are activated for the write operation. At a time T5, data 416 to be written in response to the WRITE command 406 is provided to the memory device 200 on the data terminals DQ0–DQ3. The data 416 will be written to the memory location at the intersection of the row corresponding to address signals A0–A14 latched at the time T2 and the column corresponding to the address signals A0–A11 latched at the time T3. Only the portions of the row corresponding to the sub-banks selected by the address signals A12–A14 at the time T3 are activated for the write operation.

Also at the time T5, a READ command 408 is provided to the memory device 200 to request a read operation. Along with the READ command 408, bank addresses BA0 and BA1, and address signals A0–A11 (CA) and address signals A12–A14 are provided to identify the bank and the column for which the read operation is performed, and additionally, since the READ command 408 represents a CAS command, select the portion of the active row corresponding to the sub-bank or sub-banks identified by the address signals A12–A14 to be activated for the read operation.

At a time T6, a precharge command (PRE) 410 is provided to the memory device 200 to deactivate currently active rows of memory. As with conventional memory devices, the bank addresses BA0 and BA1 are used if the currently active row is to be deactivated in only one of the memory banks 218. In one embodiment of the present invention, some of the address signals are used to specify a precharge code. For example, the address signal A10 can be used to specify whether active rows in all memory banks 218 should be deactivated, or whether an active row in a specific memory bank identified by bank addresses BA0 and BA1 should be deactivated. In another embodiment, the address signals A12–A14 are used for the purposes of partitioning the memory bank 218 during the precharge operation, and consequently, the address signals A12–A14 cannot be used to identify sub-banks 220–223 for individual precharging operations. At a time T7, data 418 is provided on the data terminals DQ0–DQ3 in response to the read operation requested by the READ command 408 at the time T5.

Although not specifically discussed, it will be appreciated that embodiments of the present invention can be used for CAS commands other than READ, WRITE, and precharge operations. For example, conventional memory devices often include an auto-precharge operation, where the precharge operation is handled without input or intervention by the user. An embodiment of the present invention can include such functionality, but with the flexibility of having auto-precharge capability for specific portions of rows of memory cells. As a result, the power consumed for auto-precharge operations can be reduced, and spread over a longer period of time to reduce the average power consumption.

More generally, embodiments of the present invention can provide greater flexibility than conventional memory devices in that "extra pins" of a memory device, which may be used only under specific conditions, or for specific commands, can also be used for other functions. Thus, the particular embodiments previously discussed with respect to selecting sub-banks of memory banks for which a portion of a row of memory is activated, is merely exemplary, and does not limit the scope of the present invention. For example, pins unused in a particular mode of operation can be used to provide additional functionality, such as, selecting a particular bank of memory to be placed into a standby mode while other memory banks remain active, or a particular precharge mode (e.g., auto-precharge) can be set for a memory bank, whereas the other memory banks remain in a normal precharge mode. Therefore, as described herein, embodiments of the present invention take advantage of pins that remain "unused" during particular operations, conditions, or modes, to provide additional functionality or flexibility to a memory device. Such modifications to embodiments of the present invention to provide the additional functionality and flexibility are well within the scope of the present invention, and those of ordinary skill in the art will obtain sufficient understanding from the description provided herein to practice the present invention.

Figure 5:
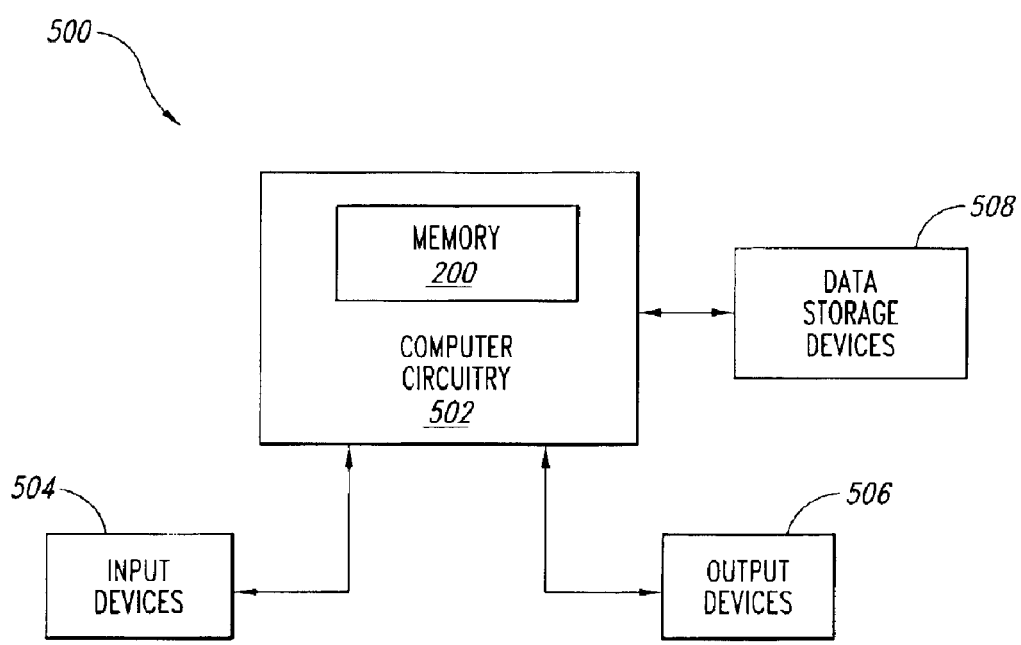
FIG. 5 is a functional block diagram of a computer system including the memory device of FIG. 2.

FIG. 5 is a block diagram of a computer system 500 including computer circuitry 502 that includes the memory device 200 of FIG. 2. Typically, the computer circuitry 502 is coupled through address, data, and control buses to the memory device 200 to provide for writing data to and reading data from the memory device. The computer circuitry 502 includes circuitry for performing various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such as output devices typically including a printer and a video terminal. One or more data storage devices 508 are also typically coupled to the computer circuitry 502 to store data or retrieve data from external storage media (not shown). Examples of typical storage devices 508 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device, comprising:

a plurality of address input terminals;

a memory array having at least one bank of memory cells, the memory cells arranged in rows and columns of memory cells;

a row address decoder coupled to the address input terminals and the memory array for selecting a row of memory cells of the bank to be accessed corresponding to a memory address provided by a first set of input signals applied to the address input terminals;

a command decoder coupled to at least one of the plurality of address input terminals and the first address decoder, the command decoder generating internal command signals and providing the internal command signals to the row address decoder circuit to activate portions of the row of memory cells to be accessed, the activated portion corresponding to a selection signal applied to at least one of the address input terminals along with a second set of input signals applied to at least a portion of the remaining address input terminals, the second set of input signals having less input signals than the first set of input signals.

2. The memory device of claim 1 wherein the bank of memory cells comprises a plurality of sub-banks and the activated portion of the row of memory cells to be accessed comprises the portion of the row of memory cells associated with the sub-banks identified by the selection signal.

3. The memory device of claim 2 wherein the command decoder comprises a command decoder to generate internal command signals and provide the internal command signals to the row address decoder circuit to activate one-half of the sub-banks in response to a first selection signal and provide the internal command signals to the row address decoder circuit to activate the other half of the sub-banks in response to a second selection signal.

4. The memory device of claim 2 wherein the command decoder comprises a command decoder to generate internal command signals and provide the internal command signals to the row address decoder circuit to activate one of four sub-banks in response to the selection signal.

5. The memory device of claim 2, further comprising a corresponding plurality of sub-bank decoders coupled to the row address decoder, each sub-bank decoder associated with one of the plurality of sub-banks.

6. The memory device of claim 1 wherein the memory array comprises a plurality of banks of memory cells, and the memory device further comprises at least one bank address terminal at which a bank address signal is applied to select which of the banks of memory cells is to be accessed.

7. The memory device of claim 1 wherein the plurality of address input terminals comprises m address input terminals, the first set of input signals comprises m input signals, the second set of input signals comprises n input signals, and the selection signal comprises less than or equal to (m-n) signals.

8. A memory device having address terminals for receiving input signals and command terminals for receiving command signals, the memory device comprising:

a memory array having at least one bank of memory partitioned into a plurality of sub-banks of memory cells, the memory cells in each sub-bank arranged in rows and columns of memory cells;

a first address decoder coupled to the address terminals and the memory array to select a row of memory to be accessed corresponding to a memory address represented by a first set of input signals applied to the address terminals;

a second address decoder coupled to a first portion of the address terminals and the memory array to select a column of memory to be accessed corresponding to a memory address represented by a second set of input signals applied to the first portion of the address terminals, the second set of input signals having less input signals than the first set of input signals;

a command decoder coupled to the address terminals and the first address decoder, the command decoder generating internal control signals for performing a requested memory operation in response to receiving command signals; and a sub-bank control circuit coupled to a second portion of the address terminals and the command decoder, in response to sub-bank selection signals applied to the second portion of the address terminals, the sub-bank control circuit generating sub-bank control signals provided to the command decoder to select at least one of the sub-banks of memory cells on which the memory operation is performed.

9. The memory device of claim 8 wherein the memory array further includes a corresponding plurality of sub-bank decoders coupled to the first address decoder, each of the sub-bank decoders associated with a sub-bank of memory cells.

10. The memory device of claim 8 wherein the address terminals comprise m address terminals, the first set of input signals comprises m input signals, the second set of input signals comprises n input signals, and the sub-bank selection signal comprises less than or equal to (m-n) signals.

11. The memory device of claim 8 wherein, in the event of receiving command signals requesting a memory operation to access the memory cells of a bank of memory, the command decoder comprises a command decoder generating internal control signals and providing the same to the first address decoder to select a row of memory to be accessed and further activate portions of the row of memory to be accessed corresponding to the sub-banks of memory selected by the sub-bank control signals.

12. The memory device of claim 8 wherein the memory array comprises a plurality of banks of memory, and the memory device further comprises at least one bank address terminal to which a bank address is applied to select which of the plurality of banks of memory the memory operation is performed.

13. The memory device of claim 8 wherein the sub-bank control circuit comprises a sub-bank control circuit adapted to generate sub-bank control signals to select one-half of the sub-banks of memory cells, one-fourth of the sub-banks of memory cells, or all of the sub-banks of memory cells on which the memory operation is performed.

14. A memory device having address input terminals and command input terminals to which input signals are applied, the memory device comprising:

a memory array having at least one bank of memory cells, the memory cells arranged in rows and columns of memory cells;

an address decoder coupled to the address input terminals and to rows of memory cells; and a command decoder coupled to the command and address input terminals and the address decoder, the command decoder generating internal control signals and providing the same to the address decoder for activating selected portions of a row of memory cells based on a memory address represented by input signals applied to the address input terminals concurrently with the application of a first set of command input signals to the command input terminals and further based on a selection signal applied to at least one of the address input terminals concurrently with the application of a second set of command input signals to the command input terminals.

15. The memory device of claim 14 wherein the memory array comprises a plurality of banks of memory cells, and the memory device further comprises at least one bank address terminal to which a bank address is applied to select one of the plurality of banks of memory cells.

16. The memory device of claim 14 wherein the memory array comprises at least one bank of memory cells partitioned into a plurality of sub-banks and the memory array further includes a corresponding plurality of sub-bank decoders, each sub-bank decoder associated with a sub-bank to activate the selected portion of a row of memory cells.

17. The memory device of claim 16 wherein the command decoder comprises a command decoder adapted to generate internal control signals to activate one half of the sub-banks, one-fourth of the sub-banks, or all of the sub-banks based on the selection signal.

18. The memory device of claim 14 wherein the address decoder is a row address decoder and the memory device further comprises a column address decoder coupled to the memory array to select a column of memory cell based on a column address signals applied to a first portion of the address input terminals concurrently with the application of the selection signal, the address input terminals comprise m address input terminals, the input signals applied to the address input terminals concurrently with the application of the first set of command input signals comprises m input signals, the column address signals comprise n signals, and the selection signal comprises less than or equal to (m-n) signals.

19. A computer system, comprising:

a data input device;

a data output device;

a processor coupled to the data input and output devices; and a memory device coupled to the processor, comprising, a plurality of address input terminals;

a memory array having at least one bank of memory cells, the memory cells arranged in rows and columns of memory cells;

a row address decoder coupled to the address input terminals and the memory array for selecting a row of memory cells of the bank to be accessed corresponding to a memory address provided by a first set of input signals applied to the address input terminals;

a command decoder coupled to at least one of the plurality of address input terminals and the first address decoder, the command decoder generating internal command signals and providing the internal command signals to the row address decoder circuit to activate portions of the row of memory cells to be accessed, the activated portion corresponding to a selection signal applied to at least one of the address input terminals along with a second set of input signals applied to at least a portion of the remaining address input terminals, the second set of input signals having less input signals than the first set of input signals.

20. The computer system of claim 19 wherein the bank of memory cells of the memory device comprises a plurality of sub-banks and the activated portion of the row of memory cells to be accessed comprises the portion of the row of memory cells associated with the sub-banks identified by the selection signal.

21. The computer system of claim 20 wherein the command decoder of the memory device comprises a command decoder to generate internal command signals and provide the internal command signals to the row address decoder circuit to activate one-half of the sub-banks in response to a first selection signal and provide the internal command signals to the row address decoder circuit to activate the other half of the sub-banks in response to a second selection signal.

22. The computer system of claim 20 wherein the command decoder of the memory device comprises a command decoder to generate internal command signals and provide the internal command signals to the row address decoder circuit to activate one of four sub-banks in response to the selection signal.

23. The computer system of claim 20 wherein the memory device further comprises a corresponding plurality of sub-bank decoders coupled to the row address decoder, each sub-bank decoder associated with one of the plurality of sub-banks.

24. The computer system of claim 19 wherein the memory array of the memory device comprises a plurality of banks of memory cells, and the memory device further comprises at least one bank address terminal at which a bank address signal is applied to select which of the banks of memory cells is to be accessed.

25. The computer system of claim 19 wherein the plurality of address input terminals of the memory device comprises m address input terminals, the first set of input signals comprises m input signals, the second set of input signals comprises n input signals, and the selection signal comprises less than or equal to (m-n) signals.

26. A computer system, comprising:
a data input device;
a data output device;
a processor coupled to the data input and output devices; and
a memory device coupled to the processor, the memory device having address terminals for receiving input signals and command terminals for receiving command signals, the memory device comprising:
a memory array having at least one bank of memory partitioned into a plurality of sub-banks of memory cells, the memory cells in each sub-bank arranged in rows and columns of memory cells;
a first address decoder coupled to the address terminals and the memory array to select a row of memory to be accessed corresponding to a memory address represented by a first set of input signals applied to the address terminals;
a second address decoder coupled to a first portion of the address terminals and the memory array to select a column of memory to be accessed corresponding to a memory address represented by a second set of input signals applied to the first portion of the address terminals, the second set of input signals having less input signals than the first set of input signals;
a command decoder coupled to the address terminals and the first address decoder, the command decoder generating internal control signals for performing a requested memory operation in response to receiving command signals; and a sub-bank control circuit coupled to a second portion of the address terminals and the command decoder, in response to sub-bank selection signals applied to the second portion of the address terminals, the sub-bank control circuit generating sub-bank control signals provided to the command decoder to select at least one of the sub-banks of memory cells on which the memory operation is performed.

27. The computer system of claim 26 wherein the memory array of the memory device further includes a corresponding plurality of sub-bank decoders coupled to the first address decoder, each of the sub-bank decoders associated with a sub-bank of memory cells.

28. The computer system of claim 26 wherein the address terminals of the memory device comprise m address terminals, the first set of input signals comprises m input signals, the second set of input signals comprises n input signals, and the sub-bank selection signal comprises less than or equal to (m-n) signals.

29. The computer system of claim 26 wherein, in the event of receiving command signals requesting a memory operation to access the memory cells of a bank of memory, the command decoder of the memory device comprises a command decoder generating internal control signals and providing the same to the first address decoder to select a row of memory to be accessed and further activate portions of the row of memory to be accessed corresponding to the sub-banks of memory selected by the sub-bank control signals.

30. The computer system of claim 26 wherein the memory array of the memory device comprises a plurality of banks of memory, and the memory device further comprises at least one bank address terminal to which a bank address is applied to select which of the plurality of banks of memory the memory operation is performed.

31. The computer system of claim 26 wherein the sub-bank control circuit of the memory device comprises a sub-bank control circuit adapted to generate sub-bank control signals to select one-half of the sub-banks of memory cells, one-fourth of the sub-banks of memory cells, or all of the sub-banks of memory cells on which the memory operation is performed.

32. In a memory device having a plurality of input address terminals, a method for accessing a memory array having at least one bank of memory cells arranged in rows and columns of memory cells, the method comprising:
receiving a first set of input address signals at the plurality of input address terminals;
selecting a row of memory to be activated in the bank of memory corresponding to a row address represented by the first set of input address signals;
receiving a second set of input address signals at a first portion of the plurality of input address terminals, the second set of input address signals having less input signals than the first set of input address signals;
receiving sub-bank selection signals concurrently with the second set of input address signals on a second portion of the plurality of input address terminals;
activating portions of the row of memory to be activated corresponding to the sub-bank selection signals; and
selecting a column of memory to be accessed in the bank of memory corresponding to a column address represented by the second set of input address signals.

33. The method of claim 32 wherein receiving a first set of input address signals comprises receiving m input address signals, receiving a second set of input address signals comprises receiving n input address signals, and receiving sub-bank selection signals comprises receiving less than or equal to (m-n) input signals.

34. The method of claim 32 wherein the bank of memory cells is partitioned into a plurality of sub-banks, and activating portions of the row of memory comprises activating the portion of the row of memory corresponding to a sub-bank selected by the sub-bank selection signals.

35. The method of claim 34 wherein activating the portion of the row of memory comprises activating the portion of the row of memory corresponding to half of the sub-banks, activating the portion of the row of memory corresponding to one-fourth of the sub-banks, or activating the portion of the row of memory corresponding to all of the sub-banks based on the sub-bank selection signals.

36. In a memory device having a plurality of address terminals and command terminals, the memory device further having a memory array having at least one bank of memory cells arranged in rows and columns of memory cells, a method of performing a memory operation on the memory array comprising:

receiving command signals on the command terminals indicative of a memory operation;

receiving a first set of address signals on the plurality of address terminals;

receiving a second set of address signals on a first portion of the plurality of address terminals;

receiving sub-bank selection signals on a second portion of the plurality of address terminals concurrently with the second set of address signals; and activating a portion of the bank of memory selected by the sub-bank selection signals and performing the memory operation thereon.

37. The method of claim 36 wherein receiving a first set of address signals comprises receiving m address signals, receiving a second set of address signals comprises receiving n address signals, and receiving sub-bank selection signals comprises receiving less than or equal to (m-n) input signals.

38. The method of claim 36 wherein the bank of memory cells is partitioned into a plurality of sub-banks, and activating a portion of the bank of memory comprises activating the sub-banks selected by the sub-bank selection signals.

39. The method of claim 38 wherein activating the portion of the bank of memory comprises activating half of the sub-banks, activating one-fourth of the sub-banks, or activating all of the sub-banks based on the sub-bank selection signals.

* * * * *